(12) United States Patent
Mehrad et al.

(10) Patent No.: US 6,284,599 B1
(45) Date of Patent: Sep. 4, 2001

(54) METHOD TO FABRICATE A SEMICONDUCTOR RESISTOR IN EMBEDDED FLASH MEMORY APPLICATION

(75) Inventors: Freidoon Mehrad; George R. Misium, both of Plano; John H. MacPeak, Garland, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/585,059

(22) Filed: Jun. 1, 2000

Related U.S. Application Data

(60) Provisional application No. 60/143,398, filed on Jul. 12, 1999, provisional application No. 60/117,774, filed on Jan. 29, 1999, and provisional application No. 60/068,543, filed on Dec. 23, 1997.

(51) Int. Cl.[7] .................................................. H01L 21/336
(52) U.S. Cl. ........................................... 438/257; 438/267
(58) Field of Search .................................. 438/257, 258, 438/259, 260, 261, 262, 263, 264, 265, 266, 267, 297, 529

(56) References Cited

U.S. PATENT DOCUMENTS

| | | | |
|---|---|---|---|
| 5,796,135 | * 8/1998 | Liang et al. | 257/296 |
| 5,908,311 | * 6/1999 | Chi et al. | 438/258 |
| 5,981,341 | * 11/1999 | Kim et al. | 438/264 |
| 6,004,829 | * 12/1999 | Chang et al. | 438/16 |
| 6,103,622 | * 8/2000 | Huang | 438/652 |

\* cited by examiner

*Primary Examiner*—David Nelms
*Assistant Examiner*—David Vu
(74) *Attorney, Agent, or Firm*—Peter K. McLarty; W. James Brady, III; Frederick J. Telecky, Jr.

(57) ABSTRACT

A method for fabricating a semiconductor resistor in embedded FLASH memory applications is described. In the method a gate stack (54) is formed on an insulating region (70) of a semiconductor substrate. The control gate (20) is removed from the gate stack (54) and electric contacts (125), (130) are formed to contact the floating gate (16) to form the resistor.

11 Claims, 6 Drawing Sheets

METHOD TO FABRICATE A SEMICONDUCTOR RESISTOR IN EMBEDDED FLASH MEMORY APPLICATION

This application claims benefit of provisional applications 60/143,398 filed Jul. 12, 1999. 60/068,543 filed Dec. 23, 1997, and 60/117,774 filed Jan. 29, 1999.

CROSS-REFERENCE TO RELATED PATENT/PATENT APPLICATIONS

The following commonly assigned patent/patent applications are hereby incorporated herein by reference:

| Patent No./Ser. No. | Filing Date | TI Case No. |
| --- | --- | --- |
| 60/068,543 | 12/23/97 | TI-23167 |
| 60/117,774 | 1/29/99 | TI-28594 |
| * | * | TI- |

FIELD OF THE INVENTION

This invention relates generally to the field of electronic devices and more particularly to a method for forming a general purpose poly-1 resistor in embedded flash memory applications

BACKGROUND OF THE INVENTION

Electronic equipment such as televisions, telephones, radios, and computers are often constructed using semiconductor components, such as integrated circuits, memory chips, and the like. The semiconductor components are typically constructed from various microelectronic devices fabricated on a semiconductor substrate, such as transistors, capacitors, diodes, resistors, and the like. Each microelectronic device is typically a pattern of conductor, semiconductor, and insulator regions formed on the semiconductor substrate.

The density of the microelectronic devices on the semiconductor substrate may be increased by decreasing spacing between each of the various semiconductor devices. The decrease in spacing allows a larger number of such microelectronic devices to be formed on the semiconductor substrate. As a result, the computing power and speed of the semiconductor component may be greatly improved.

FLASH memory, also known as FLASH EPROM or FLASH EEPROM, is a semiconductor component that is formed from an array of memory cells with each cell having a floating gate transistor. Data can be written to each cell within the array, but the data is erased in blocks of cells. Each cell is a floating gate transistor having a source, drain, floating gate, and a control gate. The floating gate uses channel hot electrons for writing from the drain and uses Fowler-Nordheim tunneling for erasure from the source. The sources of each floating gate in each cell in a row of the array are connected to form a source line.

Embedding FLASH memory circuits in CMOS logic circuits is finding increasing usage in building more complex integrated circuits such as digital signal processors for applications such as hard disk controllers. In addition to CMOS transistors and FLASH memory cells, it is necessary to have other components such as resistors as a part of the integrated circuits. These resistors are usually formed using polycyrstalline silicon which is commonly used to form the gate electrode. This polycrystalline (poly) resistor can be formed during the gate poly process where it is defined at the gate level and protected from silicidation by using an extra mask to prevent the sidewall dry etch from etching the nitride from the top of the resistor. Since the use of this extra mask is not desirable, attempts are being made to eliminate this mask. In applications where FLASH memory is used, this mask can be eliminated by using the poly-1 layer in the floating gate transistor to form the resistor. The sheet resistance of the poly-1 film is typically about 1000–2000 ohm/sq. For high frequency applications however, the capacitances associated with the poly-1 resistor and the floating gate structure make the resistance frequency dependent and therefore not suitable for use. The instant invention addresses this problem and describes a method for fabricating a general purpose poly-1 resistor in embedded FLASH applications.

SUMMARY OF THE INVENTION

The instant invention provides a method of forming a resistor in an integrated circuit containing FLASH memory cells. The method comprises: forming a first polysilicon layer over a semiconductor substrate in a first and a second region; forming an interpoly dielectric layer on said first polysilicon layer in said first and second regions; forming a second polysilicon layer on said interpoly dielectric layer in said first and second regions; removing said second polysilicon layer in said second region; forming contacts to said first polysilicon layer in said second region to form a resistor; and wherein said second polysilicon layer in said first region forms the control gate of a FLASH memory cell.

The main advantage of the instant invention is the fabrication of a resistor with a total resistance that is frequency independent.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

FIGS. 1 through 8 illustrates various aspects of an electronic device and the method of forming a poly-1 resistor in embedded FLASH applications.

Figure 1:
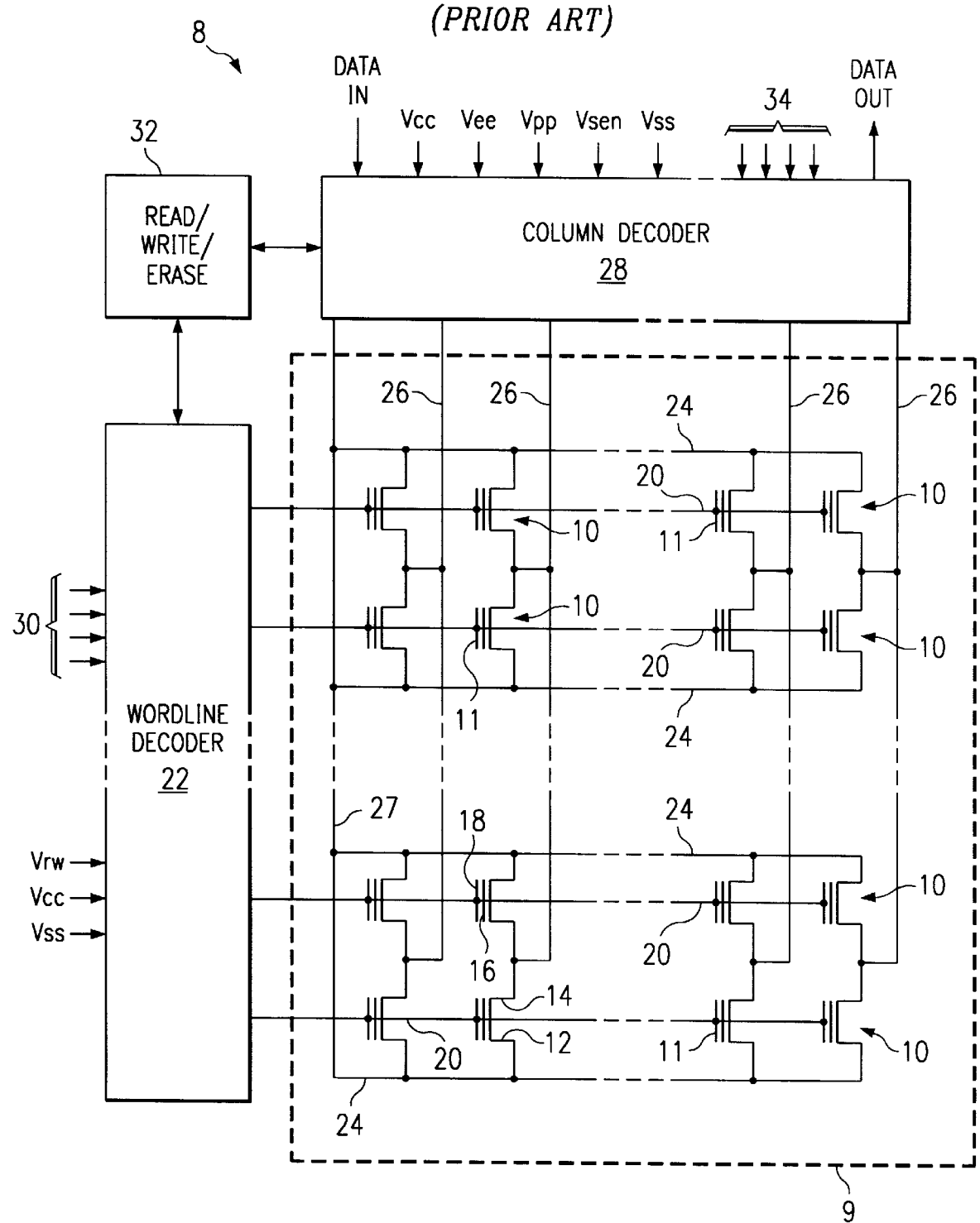
FIG. 1 is an electrical schematic diagram, in partial block diagram form, of an electronic device which includes a memory cell array in accordance with the prior art.

FIG. 1 is an electrical schematic diagram, in partial block form, of an electronic device 8 in accordance with the prior art. The electronic device 8 includes a wordline decoder 22, a column decoder 28, a Read/Write/Erase control circuit 32 for controlling the decoders 22 and 28, and a memory cell array 9. The memory cell array 9 comprises a number of memory cells 10 arranged in rows and columns. Each memory cell 10 includes a floating-gate transistor 11 having a source 12, a drain 14, a floating gate 16, and a control gate 18.

Each of the control gates 18 in a row of cells 10 is coupled to a wordline 20, and each of the wordlines 20 is coupled to the wordline decoder 22. Each of the sources 12 in a row of cells 10 is coupled to a source line 24. Each of the drains 14 in a column of cells 10 is coupled to a drain-column line 26. Each of the source lines 24 is coupled by a column line 27 to the column decoder 28 and each of the drain-column lines 26 is coupled to the column decoder 28.

In a write or program mode, the wordline decoder 22 may function, in response to wordline address signals on lines 30 and to signals from the Read/Write/Erase control circuit 32 to place a preselected first programming voltage $V_{RW}$, approximately +12V, on a selected wordline 20, which is coupled to the control gate 18 of a selected cell 10. Column decoder 28 also functions to place a second programming voltage $V_{PP}$, approximately +5 to +10V, on a selected drain-column line 26 and, therefore, the drain 14 of the selected cell 10. Source lines 24 are coupled to a reference potential $V_{SS}$ through line 27. All of the deselected drain-column lines 26 are coupled to the reference potential $V_{SS}$. These programming voltages create a high current (drain 14 to source 12) condition in the channel of the selected memory cell 10, resulting in the generation near the drain-channel junction of channel-hot electrons and avalanche breakdown electrons that are injected across the gate oxide to the floating gate 16 of the selected cell 10. The programming time is selected to be sufficiently long to program the floating gate 16 with a negative program charge of approximately −2V to −6V with respect to the gate region.

The floating gate 16 of the selected cell 10 is charged with channel-hot electrons during programming, and the electrons in turn render the source-drain path under the floating gate 16 of the selected cell 10 nonconductive, a state which is read as a "zero" bit. Deselected cells 10 have source-drain paths under the floating gate 16 that remain conductive, and those cells 10 are read as "one" bits.

In a flash erase mode, the column decoder 28 functions to leave all drain-column lines 26 floating. The wordline decoder 22 functions to connect all of the word lines 20 to the reference potential $V_{SS}$. The column decoder 28 also functions to apply a high positive voltage $V_{EE}$, approximately +10V to +15V, to all of the source lines 24. These erasing voltages create sufficient field strength across the tunneling area between floating gate 16 and the semiconductor substrate to generate a Fowler-Nordheim tunnel current that transfers charge from the floating gate 16, thereby erasing the memory cell 10.

In the read mode, the wordline decoder 22 functions, in response to wordline address signals on lines 30 and to signals from Read/Write/Erase control circuit 32, to apply a preselected positive voltage $V_{CC}$, approximately +5V, to the selected wordline 20, and to apply a low voltage, ground or $V_{SS}$, to deselected wordlines 20. The column decoder 28 functions to apply a preselected positive voltage $V_{SEN}$, approximately +1.0V, to at least the selected drain column line 28 and to apply a low voltage to the source line 24. The column decoder 28 also functions, in response to a signal on an address line 34, to connect the selected drain-column line 26 of the selected cell 10 to the DATA OUT terminal. The conductive or non-conductive state of the cell 10 coupled to the selected drain-column line 26 and the selected wordline 20 is detected by a sense amplifier (not shown) coupled to the DATA OUT terminal. The read voltages applied to the memory array 9 are sufficient to determine channel impedance for a selected cell 10 but are insufficient to create either hot-carrier injection or Fowler-Nordheim tunneling that would disturb the charge condition of any floating gate 16.

For convenience, a table of read, write and erase voltages is given in TABLE 1 below:

TABLE 1

|  | Read | Write | Flash Erase |
|---|---|---|---|
| Selected Wordline | 5 V | 12 V | 0 V (All) |
| Deselected Word lines | 0 V | 0 V | — |
| Selected Drain Line | 1.0 V | 5–10 V | Float (All) |
| Deselected Drain Lines | Float | 0 V | — |
| Source lines | 0 V | About 0 V | 10–15 V (All) |

Figure 2:
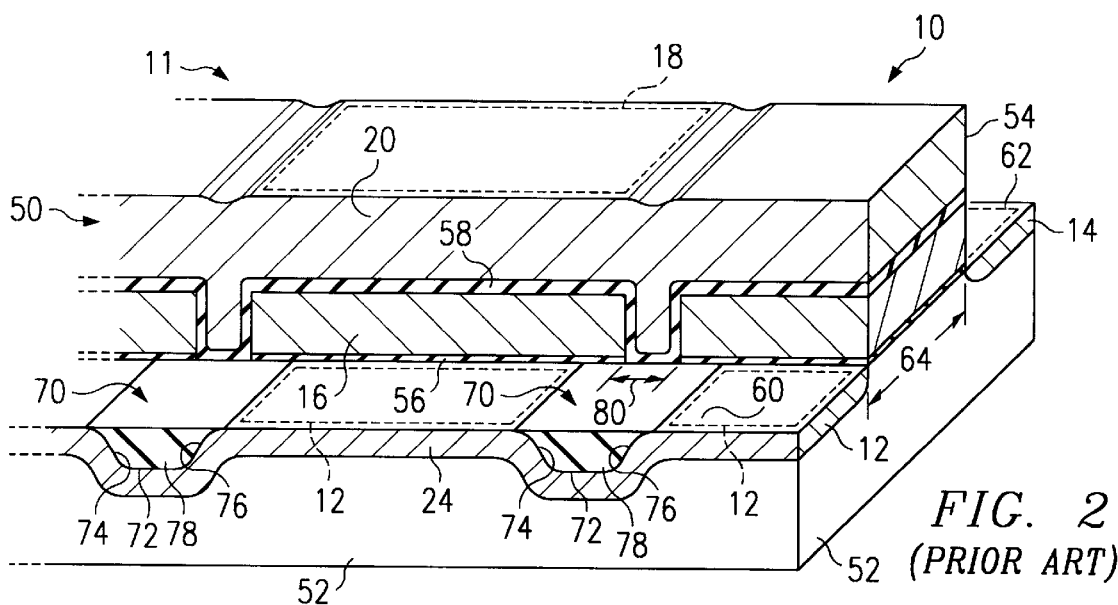
FIG. 2 is a perspective view of a portion of the memory cell array of FIG. 1.
Figure 3:
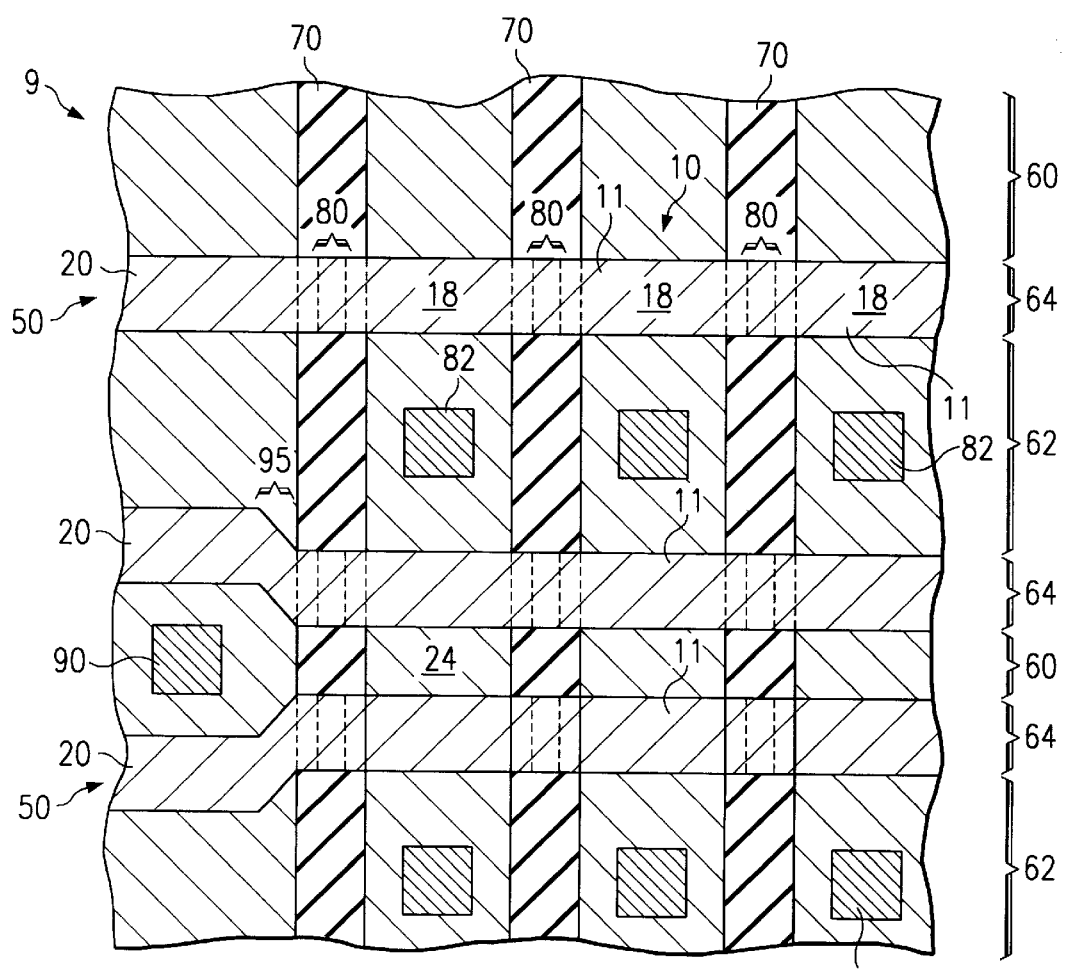
FIG. 3 is an enlarged plan view of a portion of the memory cell of FIG. 1.

FIGS. 2 and 3 illustrate the structure of a portion of the memory array 9 illustrated in FIG. 1. Specifically, FIG. 2 is a perspective view of a portion of the memory array 9 and FIG. 3 is an enlarged plan view of a portion of memory array 9. As discussed previously, the memory array 9 includes a number of memory cells 10 arranged in rows and columns.

As best illustrated in FIG. 2, each row of memory cells 10 is formed from a continuous stack structure 50 that includes a number of memory cells 10. The floating gate transistor 11 within each memory cell 10 is formed on a semiconductor substrate 52 and separated from each adjacent memory cell 10 in the continuous stack structure 50 by a shallow trench isolation structure 70. The semiconductor substrate 52 includes a source region 60 and a drain region 62 separated by a channel region 64. The floating gate transistor 11 is generally fabricated by forming a gate stack 54 outwardly from a portion of the channel region 64 and doping a portion of the source region 60 and a portion of the drain region 62 adjacent the gate stack 54 to form a source 12 and a drain 14, respectively.

The semiconductor substrate 52 may comprise a wafer formed from a single-crystalline silicon material. The semiconductor substrate 52 may include an epitaxial layer, a recrystallized semiconductor material, a polycrystalline semiconductor material, or any other suitable semiconductor material.

The regions 60, 62, and 64 are substantially parallel and may extend the length of the memory array 9. The channel region 64 of the semiconductor substrate 52 is doped with impurities to form a semiconductive region. The channel region 64 of the semiconductor substrate 12 may be doped with p-type or n-type impurities to change the operating characteristics of a microelectronic device (not shown) formed on the doped semiconductor substrate 52.

As best illustrated in FIG. 2, the floating gate transistors 11 in each continuous stack structure 50 in the memory array 9 are electrically isolated from one another by the shallow trench isolation (STI) structure 70. The STI structures 70 are generally formed prior to the fabrication of the gate stack 54 on the semiconductor substrate 52. The STI structures 70 are formed by etching a trench 72 into the semiconductor substrate 52. The trench 72 is generally on the order of 0.2 to 8.5 μm in depth. The trench 72 comprises a first sidewall surface 74 and a second sidewall surface 76.

The trench 72 is then filled with a trench dielectric material 78 to electrically isolate the active regions of the semiconductor substrate 52 between the STI structures 70. The trench dielectric material 78 may comprise silicon dioxide, silicon nitride, or a combination thereof. The trench dielectric material 78 is generally etched back, followed by a deglaze process to clean the surface of the semiconductor substrate 52 prior to fabrication of the gate stack 54.

The continuous stack structure 50 is then fabricated outwardly from the semiconductor substrate 52 and the filled trench 72. The continuous stack structure 50 is formed from a series of gate stacks 54 fabricated outwardly from the channel region 64 of the semiconductor substrate 52. As best shown in FIG. 2, the gate stack 54 comprises a gate insulator 56, the floating gate 16, an interstitial dielectric 58, and the control gate 18. The gate insulator 56 is formed outwardly from the semiconductor substrate 52, and the floating gate 16 is formed outwardly from the gate insulator 56. The interstitial dielectric 58 is formed between the floating gate 16 and the control gate 18 and operates to electrically isolate the floating gate 16 from the control gate 18.

The gate insulator 56 is generally grown on the surface of the semiconductor substrate 52. The gate insulator 56 may comprise oxide or nitride on the order of 25 to 500 Å in thickness.

The floating gate 16 and the control gate 18 are conductive regions. The gates 16 and 18 generally comprise a polycrystalline silicon material (polysilicon) that is in-situ doped with impurities to render the polysilicon conductive. The thicknesses of the gates 16 and 18 are generally on the order of 100 nanometers and 300 nanometers, respectively.

The interstitial dielectric 58 may comprise oxide, nitride, or a heterostructure formed by alternating layers of oxide and nitride. The interstitial dielectric 58 is on the order of 5 to 40 nanometers in thickness.

As best illustrated in FIG. 3, the control gate 18 of each floating gate transistor 11 is electrically coupled to the control gates 18 of adjacent floating gate transistors 11 within adjacent continuous stack structures 50 to form a continuous conductive path. In the context of the memory array 9 discussed with reference to FIG. 1, the continuous line of control gates 18 operate as the wordline 20 of the memory array 9.

In contrast, the floating gate 16 of each floating gate transistor 11 is not electrically coupled to the floating gate 16 of any other floating gate transistor 11. Thus, the floating gate 16 in each floating gate transistor 11 is electrically isolated from all other floating gates 16. The floating gates 16 in adjacent memory cells 10 are isolated by a gap 80. The gap 80 is generally etched into a layer of conductive material (not shown) that is used to form the floating gate 16.

As shown in FIG. 2, the source 12 and the drain 14 of the floating gate transistor 11 are formed within a portion of the source region 60 and the drain region 62 of the semiconductor substrate 52, respectively. The source 12 and the drain 14 comprise portions of the semiconductor substrate 52 into which impurities have been introduced to form a conductive region. The drains 14 of each floating gate transistor 11 in a column are electrically coupled to each other by a number of drain contacts 82 to form the drain column line 26 (not shown). The drain column line 26 is generally formed outwardly from the wordline 20. As will be discussed in greater detail below, the source 12 of each floating gate transistor 11 forms a portion of the source line 24 and is formed during the fabrication of the source line 24.

As best illustrated in FIG. 2, a portion of the source line 24 forms the source 12 of the floating gate transistor 11. The source line 24 connects the sources 12 to each other by a continuous conductive region formed within the semiconductor substrate 52 proximate the source region 60. As best illustrated in FIG. 2, the source line 24 crosses the STI structures 70 in the source region 60 of the semiconductor substrate 52 below the STI structures 70. In contrast, the STI structures 70 electrically isolate the adjacent floating gate transistors 11 in the channel region 64 of the semiconductor substrate.

The source line 24, and correspondingly the sources 12 of each floating gate transistor 11, is generally fabricated after at least a portion of the gate stack 54 has been fabricated. The gate stack 54 is pattern masked (not shown) using conventional photolithography techniques, leaving the semiconductor substrate 52, proximate the source region 60, exposed. The exposed region of the semiconductor substrate 52 is then etched to remove the trench dielectric material 78 in the exposed region. The etching process to remove the trench dielectric material 78 may be an anisotropic etching process. Anisotropic etching may be performed using a reactive ion etch (RIE) process using carbon-fluorine based gases such as $CF_4$ or $CHF_3$.

The semiconductor substrate 52 proximate the source region 60, including that portion of the semiconductor substrate 52 forming the trench 72, is doped with impurities to render the region conductive. The conductive region is then thermally treated to diffuse the impurities into the source region 60 of the semiconductor substrate 52. The diffused conductive region forms both the source 12 of each floating gate transistor 11 as well as the source line 24. The source region 60 of the semiconductor substrate 52 is generally doped by an implantation process in which dopant ions are impacted into the semiconductor substrate 52. After formation of the source line 24, and as a part of subsequent processing, the trench 72 is refilled with a dielectric material.

Shown in FIG. 3 is the source line contact 90. In typical FLASH memory layout design there is one source contact for every sixteen drain contacts. Because of the spacing of the source line the word line 20 has to bend 95 around the source contact 90. In addition for high density designs, the width of the drain region 62 is larger than the width of the source region 60. This results in a non-uniform spacing of the wordlines 20.

Figure 4:
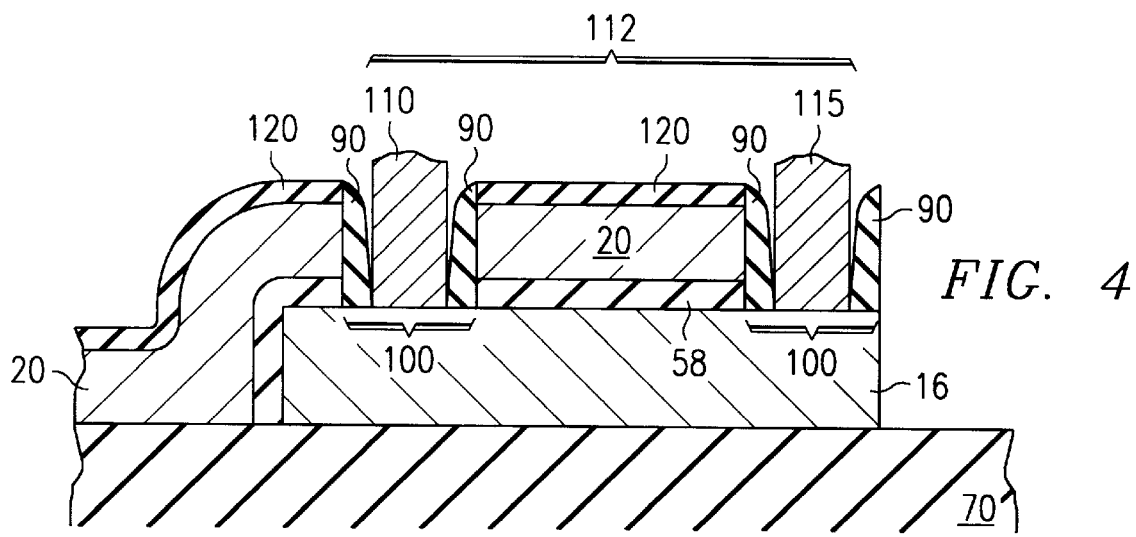
FIG. 4 is cross-sectional view of an FLASH memory cell poly-1 resistor in accordance with the prior art.

Shown in FIG. 4 is a floating gate (poly-1) resistor 112 fabricated in accordance with the prior art. This resistor may be part of an integrated circuit that contains embedded FLASH memory circuits among CMOS circuits. In this application the resistor is typically formed on large areas of the isolation oxide 70. This isolation oxide can be formed using a LOCOS or a STI process. To form the poly-1 resistor structure 112, the FLASH cell gate stack is formed as described above. The openings 100 are formed over the floating gate during the gate etch process of the CMOS circuits which occurs after floating gate stack formation. A layer of photoresist is formed on the circuit and patterned to define the CMOS gate structures and the openings over the floating gate 100. During the polysilicon etch process used to define the CMOS gate structures, the openings 100 will be formed. Sidewall nitride structures 90 are formed to isolate the contact structures 110 and 115 from the control gate 20. The contacts 110 and 115 will provide electrical contact to the poly-1 resistor structure formed using the poly-1 (floating gate) layer 16. As shown in FIG. 4, the control gate 20 and the poly-1 (floating gate) 16 are separated by the interpoly dielectric 58. As described earlier, this interpoly dielectric can comprise layers of silicon oxide and silicon nitride. During the sequence of processes used to complete the integrated circuit, a low resistivity layer of titanium, tungsten or cobalt silicide 120 will be formed on the control gate 20. This layer typically has a sheet resistivity of about 1–8 ohm/sq.

Figure 5:
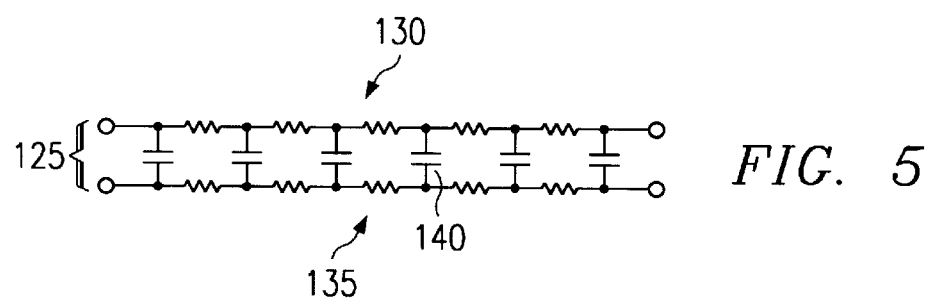
FIG. 5 is an equivalent circuit of the distributed resistor and capacitor network of the FLASH poly-1 resistor illustrated in FIG. 4.

Shown in FIG. 5 is the equivalent circuit for the poly-1 resistor structure illustrated in FIG. 4. The circuit comprises a distributed resistor capacitor network 125. The line of resistors 135 are due to the resistivity of the poly-1 (floating gate) layer 16. The line of resistors 130 are due to the presence of the control gate layer 20 and the silicide layer 120. The capacitors 140 are due to the presence of the interpoly dielectric layer 58. For high frequency applications such as wireless communications, the reactance of the capacitors 140 (which is inversely proportional to the frequency) will decrease. This will cause the low resistivity silicide layer 120 to have a larger contribution to the overall resistance of the structure resulting in a decrease in the resistance between contacts 100 and 115. This decrease in resistance makes the structure of FIG. 4 unsuitable for high frequency applications.

Figure 6:
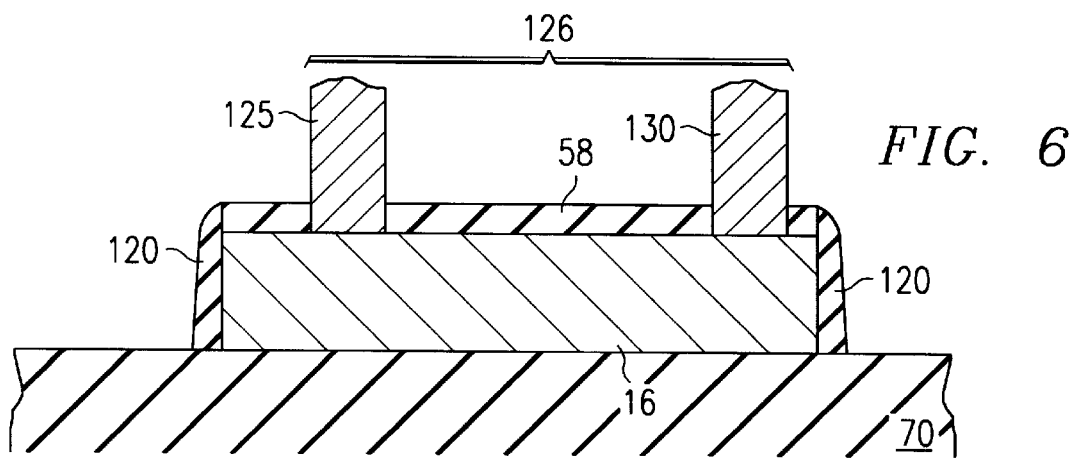
FIG. 6 is a cross-sectional view of an embodiment of the instant invention.

Shown in FIG. 6, is a general purpose poly-1 resistor 126 formed using an embodiment of the instant invention. In this embodiment, the FLASH cell gate stack is formed as described above on an insulating region 70 of the semiconductor substrate. This insulating region 70 comprises silicon oxide and can be formed using the LOCOS process or the STI process. The resistor can be embedded with other CMOS circuits or it can be in a dedicated memory integrated circuit. For the case where the memory cell is embedded with other CMOS circuits, the polysilicon gate electrode of the CMOS transistors is formed by etching a blanket layer of polysilicon using a photolithographic process and an etch process. During this process, a resist film is formed and patterned to expose areas where the polysilicon will be removed during the subsequent polysilicon etch. During this patterning step for the CMOS gates, the areas of the resist above the FLASH memory cell gate stack where the poly-1 resistors are to be formed are opened. This results in the control gate 20 of the FLASH memory cell gate stack being removed during the CMOS polysilicon gate etch process. The CMOS gate etch process has a high selectivity to oxide and the etching of the control gate 20 will stop on the top layer of the interpoly dielectric layer 58.

If the FLASH memory cell is not embedded with CMOS transistors, additional photolithography and polysilicon etch steps will have to be added. Here, a film of photoresist will be formed and patterned to open areas over those memory cells that will be used to form the poly-1 resistors. The control gates of these memory cells will be removed during the subsequent polysilicon etch process. As in the embedded FLASH memory case, the polysilicon process used here should have a high selectivity to silicon oxide and silicon nitride and should stop on the top layer of the interpoly dielectric layer 58.

Subsequent to the removal of the control gate structure, a 150A cap oxide layer is formed. Subsequent processes comprise a 100–200A nitride capping layer, a 600–1000A nitride layer, and a 800–1400A anisotropic nitride sidewall etch process. The sidewall structures 120 shown in FIG. 6 are formed during the sidewall nitride etch process. The contacts 125 and 130 are subsequently formed to provide electrical contact to the poly-1 (floating gate) structure. These contacts 125 and 130 are formed using a photolithographic process and etch process to forming openings, and a metal sputter or metal deposition process to form the contact structures 125 and 130. The interpoly dielectric layer 58 prevents the formation of a silicide layer during the silicidation process. As discussed above, this low resistivity silicide layer, if present, reduces the resistance of the resistor. The removal of the control gate structure 20 also has another very important effect. The capacitance that was associated with the floating gate (poly-1) 16, interpoly dielectric 58, and the control gate 20 of the resistor shown in FIG. 4 is not present in the structure of FIG. 6. This removes the capacitive frequency dependence of the resistance of the resistor making the resistor formed as in FIG. 6 suitable for high frequency applications.

Figure 7:
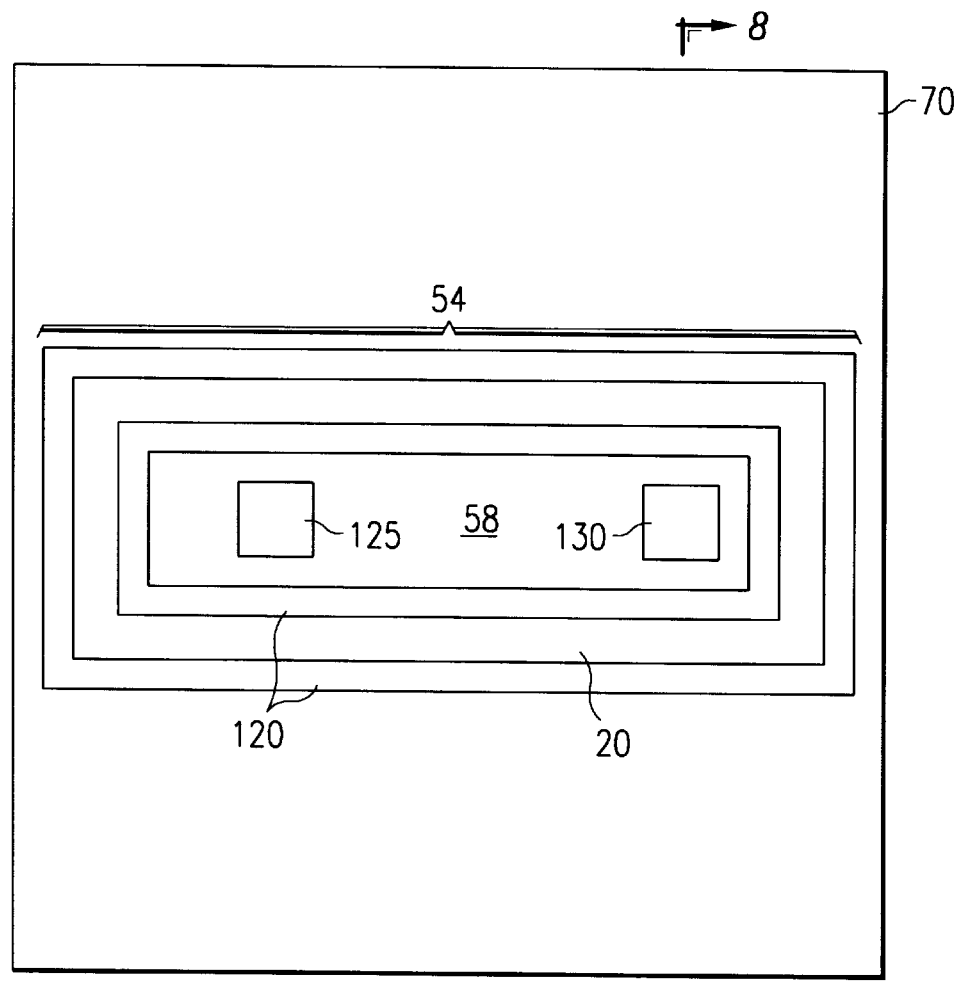
FIG. 7 is a top down view of an embodiment of the instant invention.
Figure 8:
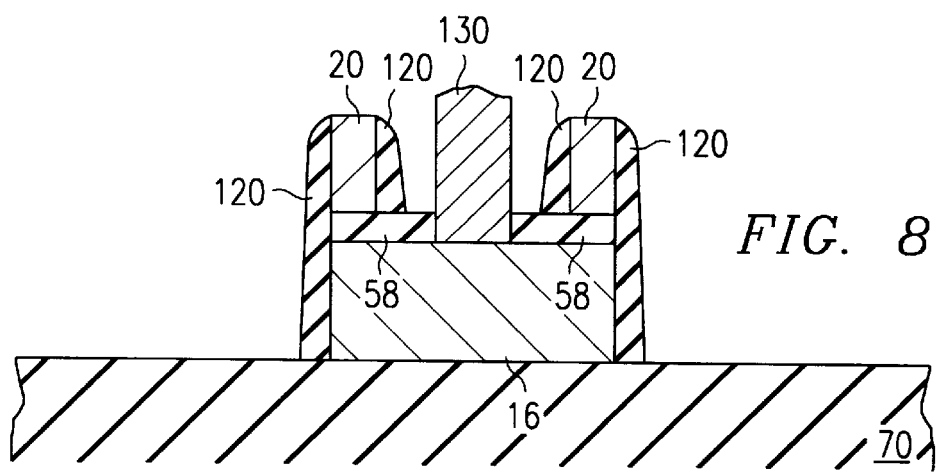
FIG. 8 is a cross-section view of the embodiment shown in FIG. 7.

Another embodiment of the instant invention is shown in FIG. 7. In this embodiment the memory cell gate stack 54 is formed on an insulator 70. During the control gate etch process, a portion of the control gate 20 is left around the edge of the structure. This is accomplished by masking the edge portion of the control gate 20 with patterned photoresist during the control gate etch process. This remaining control gate 20 will serve to protect the edges of the floating gate 16 and the interpoly dielectric layer 58 during the control gate etch. The control gate 20 can be etched as part of a CMOS gate etch process or by dedicated photolithography and polysilicon control gate etch processes. The contacts 125 and 130 provide electrical contact to the floating gate layer 16. In some cases a silicon nitride sidewall 120 will be formed. Shown in FIG. 8 is a cross-section in the plane 150 shown in FIG. 6. The sidewall structures 120 are formed using a conventional sidewall process.

Figure 9A:
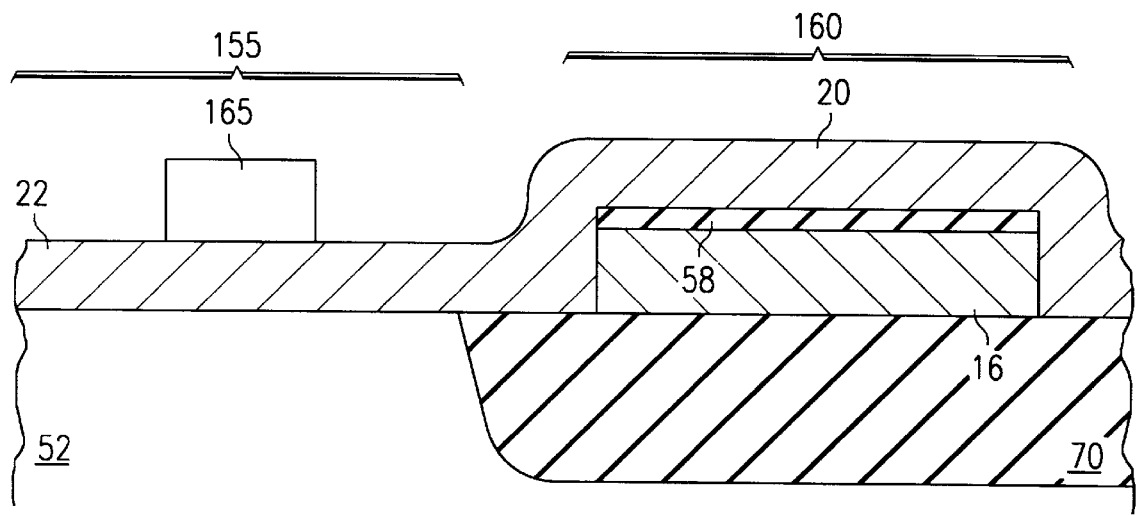
FIGS. 9A–9C are cross-sectional views of a further embodiment of the instant invention.
Figure 9B:
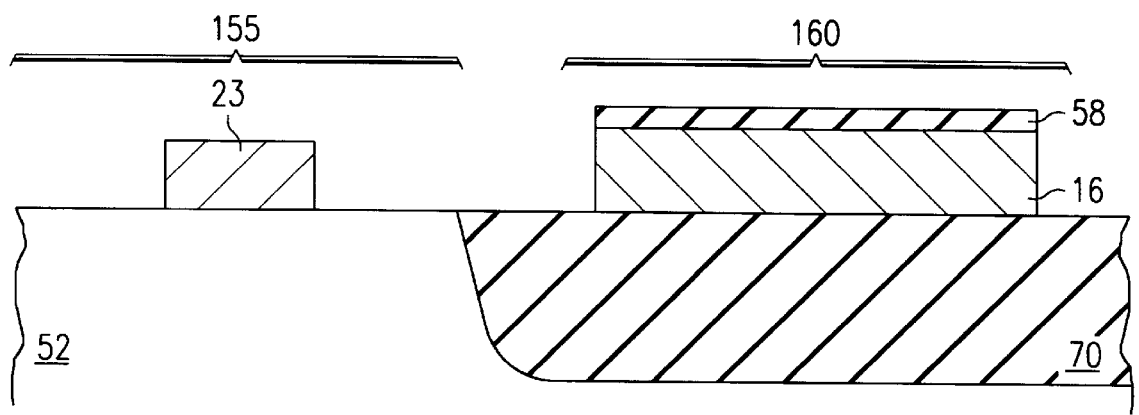
Figure 9C:
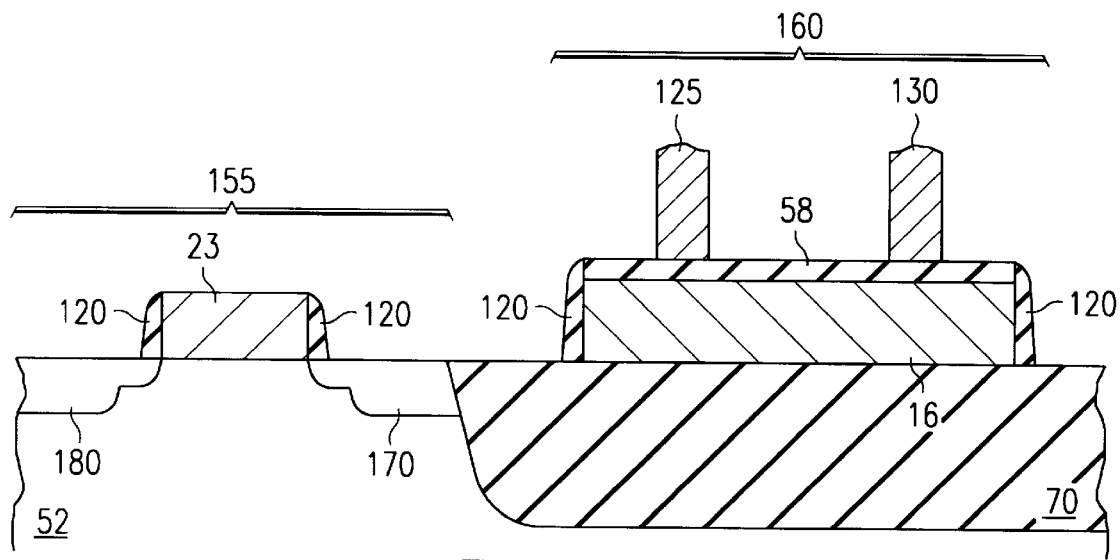

FIGS. 9A–9C illustrate another embodiment of the instant invention. Shown in FIG. 9A is a semiconductor substrate 52 with an isolation region 70. A FLASH gate stack 16, 58, 20 has been formed on the isolation region as described above. A blanket polysilicon film 22 has been formed on the substrate which will be etched to form the gate electrode of a MOS transistor. The films 22 and 20 are shown in FIG. 9A as a continuous film. This can be considered a special case of the more general case where 22 is a blanket polysilicon film that is disconnected form the control gate electrode 20. A photoresist film is formed and patterned 165 to mask the MOS transistor gate electrode portion of 22 during a subsequent polysilicon etch process. The resistor structure will be fabricated in section 160 and the MOS transistor in section 155.

Shown in FIG. 9B is the structure of FIG. 9A after the polysilicon etch process. The MOS transistor gate electrode 23 is formed from the blanket polysilicon film 22. FIG. 9C shows the completed resistor 160 and MOS transistor structures. Convention MOS processing methods are used to form the source 180 and drain 190 regions of the MOS transistor 155. The sidewalls 120 are formed simultaneously on both the resistor 160 and the MOS transistor 155. The contacts 125 and 130, as discussed above, provide electrical contact to the resistor 160.

Figure 10:
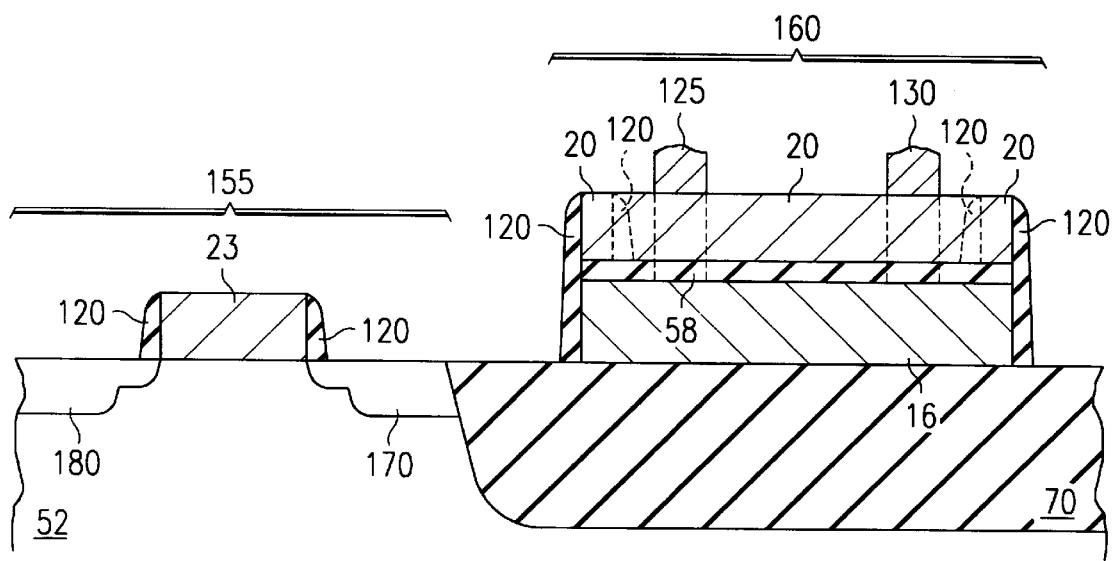
FIG. 10 is a cross-section view of a further embodiment of the instant invention.

Another embodiment of the instant invention is shown in FIG. 10. In this embodiment, a patterned photoresist film (not shown in FIG. 10) is used to leave a ring of the control gate 20 around the periphery of the resistor 160 during the polysilicon etch process used to form the MOS transistor gate electrode 23. Convention MOS processing methods are used to form the source 180 and drain 190 regions of the MOS transistor 155. The sidewalls 120 are formed simultaneously on both the resistor 160 and the MOS transistor 155. The contacts 125 and 130, as discussed above, provide electrical contact to the resistor 160.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method of fabricating a semiconductor resistor comprising:

providing a FLASH memory cell gate stack on an insulating region of a semiconductor substrate, said gate stack comprising, a floating gate, an interpoly dielectric layer on said floating gate, and a control gate film on said interpoly dielectric layer;

removing said control gate film from over said interpoly dielectric leaving a region of said control gate film only along the perimeter of said interpoly dielectric; and forming electrical contacts to said floating gate to form a resistor.

2. The method of claim 1 wherein said removing said control gate film comprises a photolithographic process and a polysilicon etch process.

3. The method of claim 1 wherein said floating gate is polysilicon.

4. The method of claim 1 wherein said control gate is polysilicon.

5. The method of claim 1 wherein said interpoly dielectric comprises alternating layers of silicon oxide and silicon nitride.

6. A method of fabricating a semiconductor resistor in embedded FLASH memory applications comprising:

providing a FLASH memory cell gate stack on an insulating region of a semiconductor substrate containing at least one MOS transistor region, said FLASH memory cell gate stack comprising, a floating gate, an interpoly dielectric layer on said floating gate, and a control gate film on said interpoly dielectric layer and said MOS transistor region;

simultaneously forming a gate electrode on said MOS transistor by etching control gate film and removing said control gate film from over said interpoly dielectric layer leaving a region of said control gate film only along the perimeter of said interpoly dielectric; and forming electrical contacts to said floating gate to form a resistor.

7. The method of claim 6 wherein simultaneously forming said gate electrode on said MOS transistor comprises etching a polysilicon film to define said gate electrode.

8. The method of claim 6 wherein said simultaneously forming said gate electrode on said MOS transistor comprises a photolithographic process and a polysilicon etch process.

9. The method of claim 6 wherein said floating gate is polysilicon.

10. The method of claim 6 wherein said control gate film is polysilicon.

11. The method of claim 6 wherein said interpoly dielectric comprises alternating layers of silicon oxide and silicon nitride.

* * * * *